United States Patent
Andrieux et al.

(10) Patent No.: US 10,784,601 B2
(45) Date of Patent: Sep. 22, 2020

(54) ELECTRIC MOTOR WITH PRINTED CIRCUIT CONNECTOR

(71) Applicant: SONCEBOZ AUTOMOTIVE SA, Sonceboz (CH)

(72) Inventors: Gaël Andrieux, Evilard (CH); Mikko Peipponen, Munich (DE); Johannes Konstantin Kuhn, Munich (DE); Thomas Schreiner, Aschheim (DE)

(73) Assignee: Sonceboz Automotive SA, Sonceboz (CH)

( * ) Notice: Subject to any disclaimer, the term of this patent is extended or adjusted under 35 U.S.C. 154(b) by 207 days.

(21) Appl. No.: 16/060,533

(22) PCT Filed: Dec. 7, 2016

(86) PCT No.: PCT/EP2016/080016
§ 371 (c)(1),
(2) Date: Jun. 8, 2018

(87) PCT Pub. No.: WO2017/097807
PCT Pub. Date: Jun. 15, 2017

(65) Prior Publication Data
US 2018/0366848 A1    Dec. 20, 2018

(30) Foreign Application Priority Data
Dec. 11, 2015 (FR) ..................... 15 62199

(51) Int. Cl.
*H02K 11/30* (2016.01)
*H01R 12/58* (2011.01)
(Continued)

(52) U.S. Cl.
CPC ........... *H01R 12/585* (2013.01); *H01R 12/58* (2013.01); *H02K 1/187* (2013.01); *H02K 3/522* (2013.01);
(Continued)

(58) Field of Classification Search
CPC .... H01R 12/585; H01R 12/58; H02K 11/215; H02K 11/30; H02K 11/022;
(Continued)

(56) References Cited

U.S. PATENT DOCUMENTS 6,077,128 A    6/2000  Maag et al.
7,112,071 B2*  9/2006  Nakagawa ........... H01R 13/112
                                               439/82
(Continued)

FOREIGN PATENT DOCUMENTS

DE        10149574 A1    4/2003
DE      102004006575     9/2005
(Continued)

*Primary Examiner* — Emily P Pham
(74) *Attorney, Agent, or Firm* — Harness, Dickey & Pierce, PLC

(57) ABSTRACT

An electric motor includes an assembly for connection to a printed circuit having a conductive insert through which connection holes pass, and a coil assembly having electrical connections terminated by connection plugs. The motor further includes connection pieces comprising a rod, the outer cross-section of which matches the cross-section of the connection holes, the connection piece having, at the proximal end thereof, a shoulder with a cross-section greater than the cross-section of the connection holes, the opposite end having a slot extending up to the shoulder, and including an opening on the distal end with a width greater than or equal to the cross-section of the connection plugs and at least one narrowing with a width less than the cross-section of the connection plugs, in order to ensure the expansion of the collar of the connection piece engaged in the hole of the printed circuit insert.

20 Claims, 3 Drawing Sheets

(51) Int. Cl.
*H02K 1/18* (2006.01)
*H05K 1/02* (2006.01)
*H02K 3/52* (2006.01)
*H02K 11/215* (2016.01)
*H02K 5/22* (2006.01)
*H02K 11/22* (2016.01)

(52) U.S. Cl.
CPC .......... *H02K 5/225* (2013.01); *H02K 11/215* (2016.01); *H02K 11/30* (2016.01); *H05K 1/0263* (2013.01); *H02K 11/022* (2013.01); *H02K 2203/03* (2013.01); *H02K 2213/03* (2013.01); *H05K 2201/1059* (2013.01); *H05K 2201/10295* (2013.01); *H05K 2201/10416* (2013.01)

(58) Field of Classification Search
CPC .......... H02K 2203/03; H02K 2213/03; H02K 1/187; H02K 3/522; H02K 5/225; H05K 2201/10295; H05K 2201/10416; H05K 2201/1059; H05K 1/0263
See application file for complete search history.

(56) References Cited

U.S. PATENT DOCUMENTS

| | | | |
|---|---|---|---|
| 7,337,823 B2 | 3/2008 | Wieczorek et al. | |
| 7,377,823 B2* | 5/2008 | Chen | H01R 12/585 439/751 |
| 7,780,483 B1* | 8/2010 | Ravlich | H01R 12/585 439/751 |
| 7,946,861 B2* | 5/2011 | Sander | H01R 12/585 439/82 |
| 7,997,936 B2* | 8/2011 | Yu | H01R 13/055 439/190 |
| 9,714,849 B2 | 7/2017 | Biwersi et al. | |
| 10,491,092 B2 | 11/2019 | Rios-Quesada et al. | |
| 2002/0093259 A1 | 7/2002 | Sunaga et al. | |
| 2005/0101162 A1 | 5/2005 | Henneberg | |
| 2007/0093143 A1* | 4/2007 | Nomura | H01R 12/585 439/751 |
| 2011/0037338 A1 | 2/2011 | Leiber et al. | |
| 2015/0311771 A1 | 10/2015 | Pearce et al. | |
| 2017/0033640 A1 | 2/2017 | Le Goff et al. | |

FOREIGN PATENT DOCUMENTS

| | | |
|---|---|---|
| DE | 102010039747 | 3/2012 |
| WO | WO-2009/062469 A2 | 5/2009 |

\* cited by examiner

ELECTRIC MOTOR WITH PRINTED CIRCUIT CONNECTOR

CROSS-REFERENCE TO RELATED APPLICATIONS

This application is a National Phase Entry of International Patent Application No. PCT/EP2016/080016, filed on Dec. 7, 2016, which claims priority to French Patent Application Serial No. 15/62199, filed on Dec. 11, 2015, both of which are incorporated by reference herein.

TECHNICAL FIELD

This invention relates to the domain of electrical connection of electrical components on a circuit board, and more specifically connections enabling the passage of high currents, typically from 50 to 200 amperes, with voltages from 12 to 72 volts. A specific and non-exhaustive example of application relates to the connection of electric motor coils to a circuit board.

BACKGROUND

In the prior art, a German patent application DE102007032872 is known to describe the embodiment of an external rotor motor that has a multiplicity of excitation coils in its stator. The international patent application WO2009062469 is also known to describe an electric conductor, especially one in the form of a flat etched grid conductor. The invention particularly aims at economising copper by producing the conductor in the form of laminated composite materials, on both sides of which are placed aluminium layers.

The European patent EP1531522 discloses an electrical connection contact. The invention proposes the formation of a connection contact with a printing area that has a minimum of two layers and not less than three (for example six) spring branches through an etching and matrix process which together form a star-shaped spring. The printing area of the invention improves the electrical and mechanical connection with the conducting plate not shown (multilayer) or with an etched grid. The connection contact is done without soldering. The European patent EP0887883 discloses a contact for socketing in a metallised bore in a printed board, that has a contact spring or a contact plug, a shaft element attaching itself on its top and a connection plug forming a projection of the central shaft element.

The U.S. Pat. No. 7,377,823 relates to a spindle inserted in a hole crossing the conductor in a printed circuit board. The spindle comprises a contact portion, a shoulder portion, a part to be driven and an end portion. The contact portion constitutes the terminal of a male connector mounted on the printed circuit board in a male connector box along the shoulder part. The friction adjustment mechanism is thus made through friction in the through hole, which makes it possible to mechanically fix the spindle to be pushed into the printed circuit board.

Prior art solutions have different solutions that are adapted for the passage of high currents (typically, several kilowatts), but do not enable easy connection of an electric motor on the one hand to a printed circuit on the other hand. Furthermore, prior state of the art solutions do not enable an appropriate mode of assembly for rapidly mounting such a connection assembly (motor and printed circuit).

SUMMARY

As a solution to these disadvantages, the invention, in its most general sense, relates to an electric motor with a printed circuit comprising a conductive insert through which connection holes pass and a coil assembly with electric connections ending in connection terminals characterized in that it further comprises connection pieces that have a shank whose transverse section is complementary to the section of the said connection holes, the connection piece in its proximal end has a shoulder with a higher section than the section of the said holes while the opposite end has a slot stretching right to the said shoulder and, in its distal end, has an opening whose width is greater than or equal to the section of the said connector plugs and at least one narrowing of width less than that of the said connector plugs, in order to ensure the expansion of the collar of the said connection piece placed in the printed circuit insert.

According to a variant, said slot extends beyond the said shoulder, in the proximal direction, the connection piece that has at least one external groove to enable its insertion through an elastic deformation of the hole of the insert. According to another variant, the connection piece has two elastically deformable limbs with shoulders extending them, thus forming a slot with at least one shrinking. Preferably, the connection holes have a central portion delimited by two parallel straight edges spaced apart by a width corresponding to the thickness of the connection piece at the level of the shoulder, the central portion being extended on both sides by an enlarged area. Advantageously, the enlarged areas have parallel straight edges spaced apart by a width corresponding to that of the collar of the connection piece.

According to a variant, each of the limbs has an internal protuberance defining the shrinking. According to yet another variant, each of the limbs has an external reinforcement area below the collar, and each limb has locking lug extending from the lower end of the reinforcement to the lower level of the collar. Preferably, the connection piece is made up of a superposition of multiple superimposed conductive sheets.

According to another advantageous variant, the coil assembly is placed inside a tubular rotor, the coil assembly being made up of coils borne by teeth made up of a packet of ferromagnetic sheets, the teeth extending radially in relation to a tubular ferromagnetic core surrounding a core made up of a thermally conductive material with a first section in contact with the box and the second, smaller cross-section in contact with the tubular core of the motor; the said core is in contact with the external box of the motor in order to ensure evacuation of heat produced by the coils.

According to another variant, the ferromagnetic parts made up of sintered or injected magnetic material or a combination of packets of sheets and of similar materials. Advantageously, the thermal conductor is T-shaped. Preferably, the core has a through hole for the passage of an axle attached to the tubular rotor and driving a magnet placed near a detection probe attached to the printed circuit positioned in an extension of the core.

According to a variant, the magnet is placed in a cavity in the axle or an additional part, and the walls of the cavity serve as an electromagnetic armour. According to another variant, the probe is positioned in the axle of the core. In a particular form of embodiment, the core has a bearing for guiding the tubular rotor axle.

In another form of embodiment, the rotor comprises a transverse face with at least one through-light to ensure air flow into the coil assembly. Advantageously, the through-lights are configured to ensure the forceful passage of air during the rotation of the rotor. According to another variant, the rotating assembly comprises a ferromagnetic protuberance that forms an armour near the detection probe.

The invention also relates to a connection assembly made up of a printed circuit with a conductive insert through which connection holes pass and multiple electrical connections terminated by additional connector plugs characterized in that it further comprises connection pieces (1) that have a shank whose transverse section is complementary to the section of the said connection holes, the connection piece in its proximal end has a shoulder with a higher section than the section of the holes while the opposite end has a slot stretching right to the shoulder and, in its distal end, has an opening whose width is greater than or equal to the section of the connector plugs and at least one narrowing of width less than that of the connector plugs, in order to ensure the expansion of the collar of the connection piece placed in the printed circuit insert.

BRIEF DESCRIPTION OF THE DRAWINGS

This invention will be better understood upon reading the following description, with reference to the attached drawings where.

DETAILED DESCRIPTION

Structure of the Connection System

Figure 1:
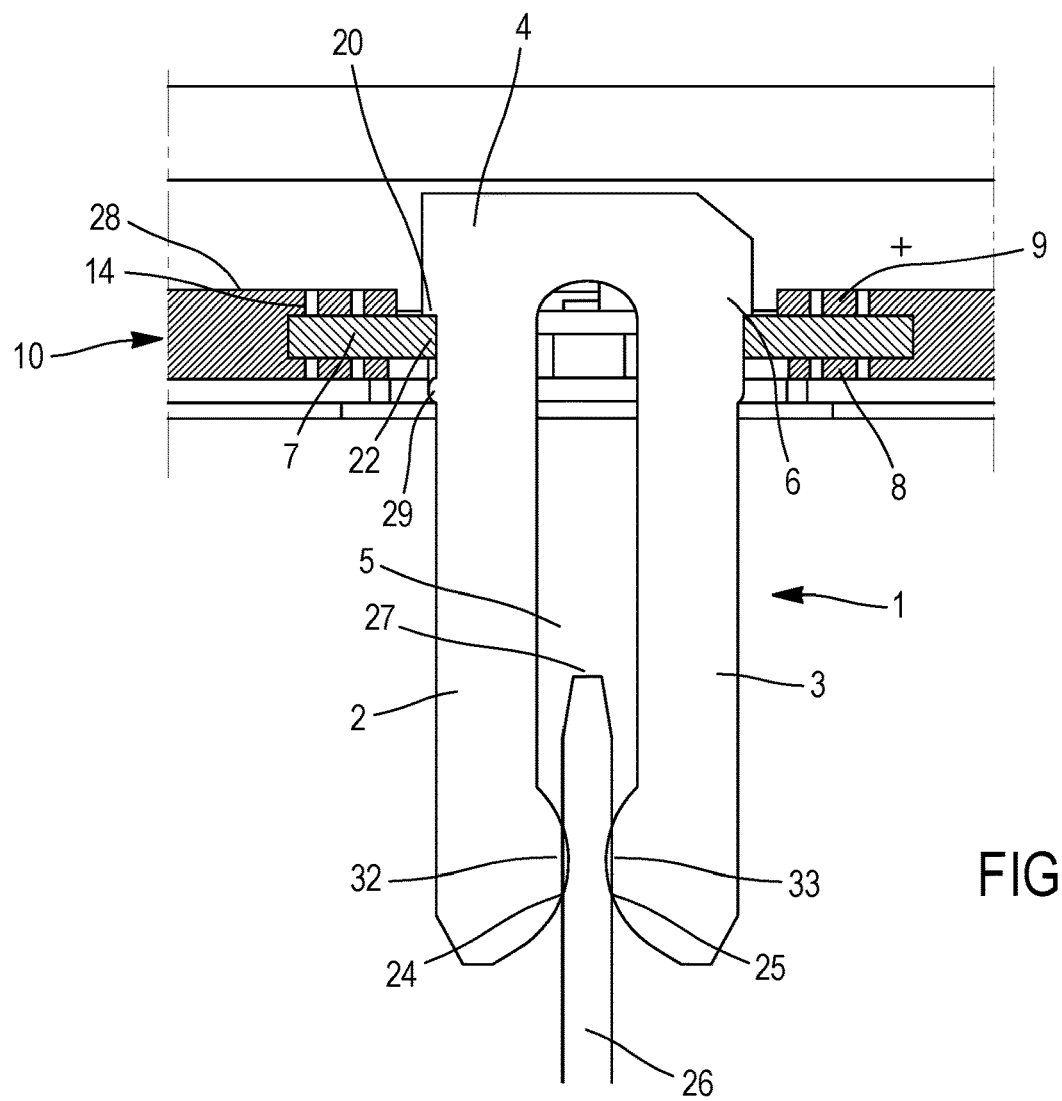
FIG. 1 shows a cross-sectional view of the entire connection assembly of the invention.

FIG. 1 represents an exemplary embodiment of a connection piece (1) with two parallel limbs (2, 3) linked to a head (4). The connection system comprises several connection pieces (1) and a printed circuit (10) with complementary metallic inserts (7). The two limbs (2, 3) define a slot (5) between them extending up to the collar (6). The connection piece (1) is made up of a stack of cut sheets. The part (1) is housed in a metal insert (7) placed between two insulating layers (8, 9) in order to form a printed circuit comprising known conductive tracks (28) in the surface of at least one of the insulating layers.

Figure 2:
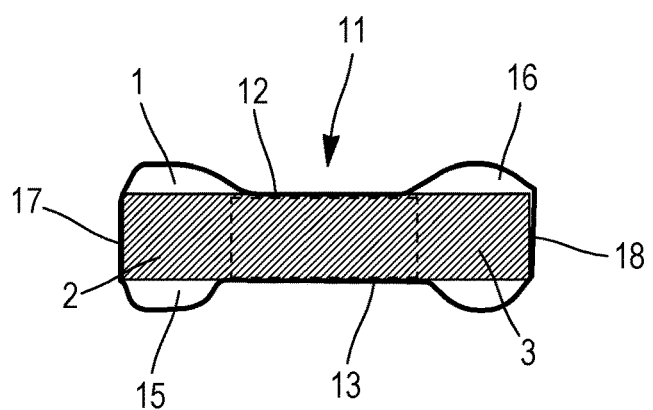
FIG. 2 shows a cross-sectional view of a connection assembly of the invention in the insert plane.

The insert (7) has an oblong shearing or cross-section of the cutting (11) with an enlarged view in FIG. 2. The shearing or cross-section of the cutting (11) has a central area delimited by two parallel straight edges (12, 13) in contact with the lateral surfaces of the head (4) of the connection piece (1). This central area extends on both sides through protuberances (15, 16) with a greater width and each has an edge (17, 18) with a complementary shape to the respective limbs (2, 3), at the collar (6) of the connection piece (1).

The areas of electrical contact between the connection piece (1) and insert (7) correspond to the edges (12, 13 and 17, 18). The insert (7) has a thickness of approximately 1 millimetre, preferably between 0.5 and 2 millimetres, thus guaranteeing enough contact surface for the passage of high electric currents, for example, 10 KW for a current of 200 amperes at 48 volts.

The enlarged areas (15, 16) enabling a tilting of the connection piece (1), thus ensuring geometric tolerance during the assembly of the connection system. The insert (7) in the example described, forms a rib (22) to ensure flexibility and facilitate the insertion of the collar (6) of the connecting part. The connecting part (1) has a shoulder (20) to limit the movement of the connection piece (1) during insertion in the printed circuit. The limbs (2, 3) each have a protuberance (32, 33) directed towards the interior of the slot (5) in order to locally reduce the width of the slot (5). The distal end of the slot (5) is flared through chamfers and/or spokes (24, 25) provided in the inner surface of the limbs respectively (2, 3).

The complementary part to be connected comprises a connecting plug (26) made up of a flat bronze or copper sheet, for example, with a pointed end (27). During the insertion of the connection piece (1) in the slot (5), the limbs are spread apart (2, 3) when the end (27) meets the protuberances (32, 33). The spacing is reflected in a slight transverse expansion of the connection piece (1) at the collar (6), thus reinforcing contact between the peripheral edge of the connection piece (1) at the level of its collar (6), and the edges (17, 18) of the insert shearing. The elasticity of the limbs (2, 3) makes it possible to control the bearing force of the collar (6) on the edge (11) of the insert (7) shearing.

In the example described in FIG. 1, the connection piece (1) has a second shoulder (29) which, together with the first shoulder (20), form the collar. The second shoulder (29) has a slightly higher portion than that of the shearing or cross-section of the cutting (11) of the insert (7). Its passage can however be forced, given the elasticity of the rib (22) provided on the sides of the insert (7) shearing and the flexibility of the connection piece (1).

The operation of this first example of embodiment is as follows:

The closed circuit is prepared together with its insert shearings (7). The inserts (7) are linked to conductor tracks (28) in the printed circuit through electrical connections (14).

The connection pieces (1) are then introduced into the insert (7) shearings by pressing them against the upper surface of the printed circuit or the insert. The flexibility of the inserts enables the forceful passage of the second shoulder (29) until the first shoulder (20) enters into contact with the upper surface of the insert (7).

The printed circuit equipped with the connection pieces is then pressed on the complementary equipment with connector plugs (26) directed towards the printed circuit. Any likely misalignment is possible because of the mobility of the connection piece (1), thus an alignment tolerance is allowed.

By pressing the equipment with plugs (26) against the printed circuit, the plugs (26) enter the matching slots (5) of the connection pieces, thus leading to the spread of the limbs (2, 3) and expansion of the connection piece (1) at its collar (6), and therefore the reinforcement of the mechanical and electrical contact between the collar (6) and the connection piece (1) as well as the insert (7).

Structure of a Motor with Such a System

Figure 4:
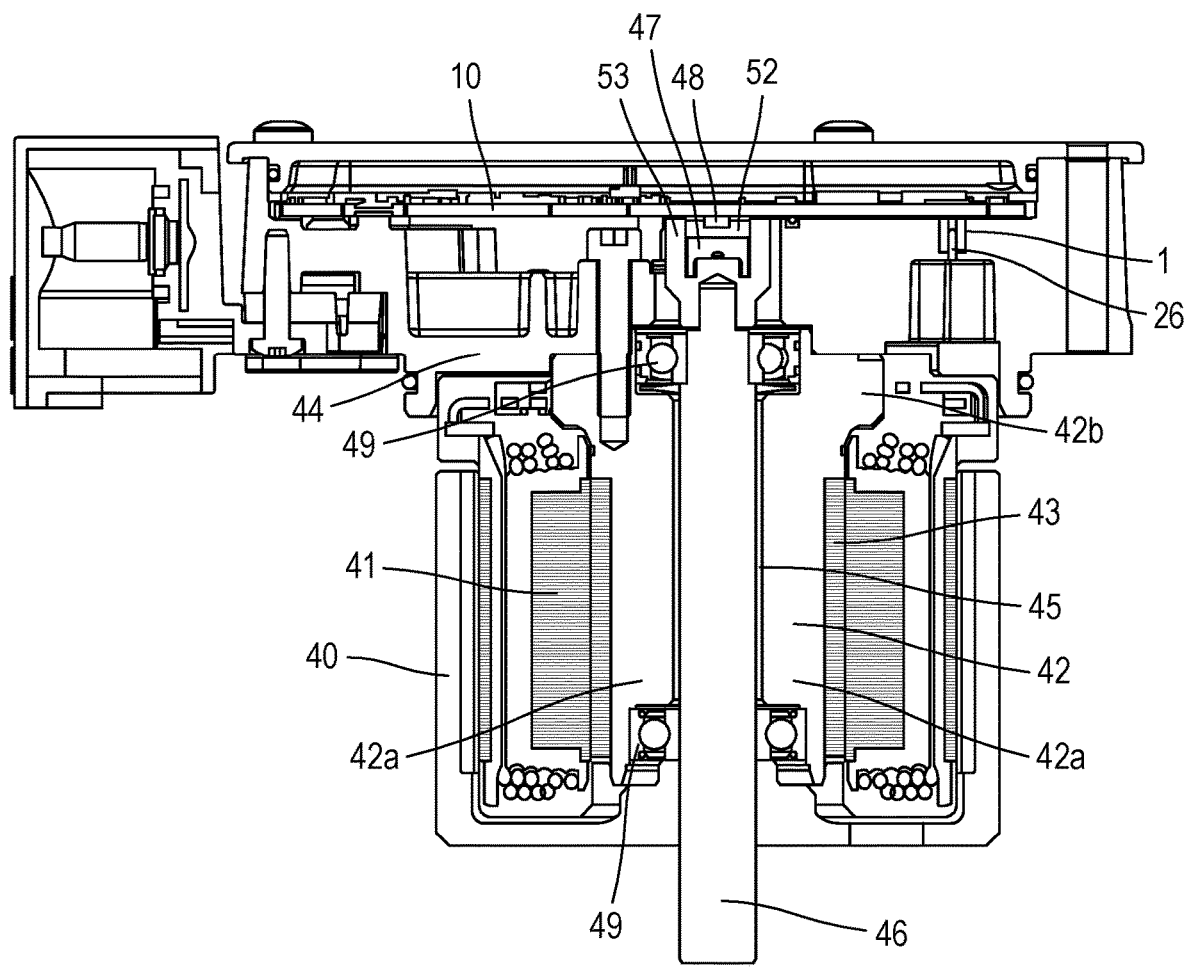
FIG. 4 shows a cross-sectional view of a motor with an external rotor according to the invention.

FIG. 4 represents an example of an external rotor motor (40) using such a connection system. The stator comprises a coiled stator (41) assembled on a core (42). The coils are supplied by conductors ending in connector plugs (26) to be inserted in the connection pieces (1) mounted on the printed circuit board (10). The advantage of such a system is that it enables the industrial production of the lower part of the motor comprising the external rotor (40) and the coiled stator on the one hand, and the upper part comprising the electronic parts on the other hand, then their simple mechanical assembly which consists in pressing the two parts against each other, in order to ensure both the mechanical and electrical assembly.

The stator has a core (42) that ensures both the mechanical strength of the coil stator (41), as well as the evacuation of power dissipated in the said coil stator. In the case of an external rotor motor, the heat produced by the coil assembly (41) is difficult to evacuate since it is confined in the motor. The invention relates to a core (42) with a first section (42*a*) surrounded by a coil stator (41), extending through a second section (42*b*) with a greater diameter and in the shape of a truncated cone. The core (42) thus has a generally T-shaped section. The second section (42*b*) is in contact with the metal box (44). This architecture makes it possible to improve the heat transfer generated by the motor coils and the iron losses to evacuate it to the metal housing (44). The core (42) has an axial discharge (45) crossed by an axle (46) attached to the external rotor (40). It drives a magnet (47) set in a detection probe (48) attached to the said printed circuit placed in the extension of the core (42). The detection probe (48) is placed in the axis of the core (42). The discharge has a bearing (49) for guiding the tubular rotor axis.

Figure 5:
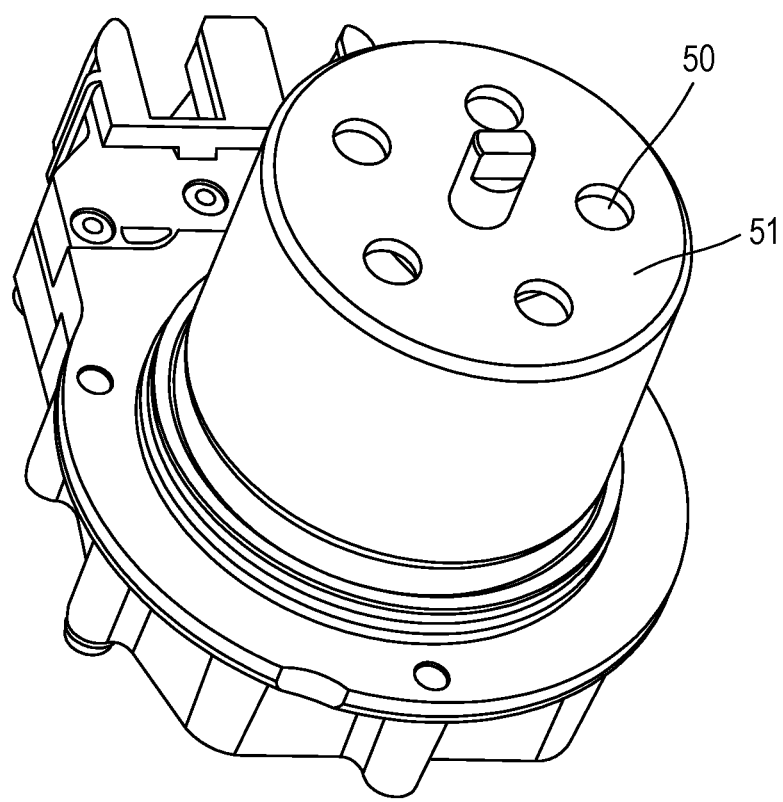
FIG. 5 shows a lower three-quarter view of the motor according to the invention.

The magnet (47) is placed in a cavity (52), with the walls of the said cavity ensuring shielding around the detection probe (48). FIG. 5 shows a bottom view of the motor. The rotor comprises a transverse face (51) with at least one through-light (50) to ensure airflow in the coil assembly (41). These through-lights (50) are configured to ensure the airflow during the rotor rotation and can be straight bore (as illustrated) or inclined bore (not shown), to enable forced circulation.

Figure 3:
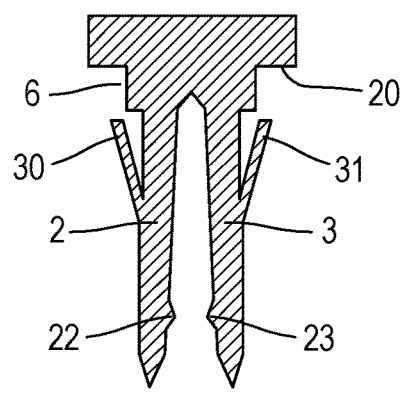
FIG. 3 shows a cross-sectional view of a variant embodiment of the connection piece.

FIG. 3 presents an alternative embodiment of the connection piece (1) which advantageously has locking lugs (30, 31) to eventually avoid the outlet of the connection piece (1) during the insertion of electrical connector plugs.

The invention claimed is:

1. An electric motor comprising:
   a printed circuit;
   a conductive insert with connection holes, said conductive insert being a separate part from said printed circuit;
   a coil assembly with electrical connections terminated by connector plugs;
   connection pieces each comprising a collar which fits within an associated one of said connection holes; and
   a proximal end of each of said connection pieces including a shoulder with a cross-section greater than said associated one of said connection holes;
   an opposite distal end of each of said connection pieces including a slot extending up to said shoulder, and an opening on said distal end having a width larger than or equal to a cross-section of an associated one of said connector plugs and at least a narrowing of said width less than said cross-section of said associated one of said connector plugs, in order to ensure expansion of said collar of each of said connection pieces engaged in said connection holes of said conductive insert.

2. The electric motor according to claim 1, wherein:
   said slot extends beyond said shoulder, in a proximal direction to enable its insertion through an elastic deformation, into said associated one of said connection holes; and
   wherein said each of said connection pieces includes at least another shoulder defining said collar.

3. The electric motor according to claim 1, wherein said each of said connection pieces has two elastically deformable and bifurcated limbs with said slot therebetween having a generally U-shape with said at least one narrowing width.

4. The electric motor according to claim 1, wherein said connection holes each has a central portion delimited by two parallel straight edges spaced apart by a dimension corresponding to a thickness of said associated one of said connection pieces at a level of said shoulder, said central portion being extended on both sides by enlarged areas.

5. The electric motor according to claim 4, wherein said enlarged areas have distant edges spaced apart by a dimension corresponding to said expansion of said collar.

6. The electric motor according to claim 3, wherein said two elastically deformable and bifurcated limbs each has an internal protuberance defining said at least one narrowing width.

7. The electric motor according to claim 3, wherein each of said two elastically deformable and bifurcated limbs has an external reinforcement area below said collar, and said each of said two elastically deformable and bifurcated limbs has locking lugs extending from a lower end of said external reinforcement to a lower level of said collar.

8. The electric motor according to claim 1, wherein said connection pieces are made up of a superposition of a multiplicity of conducting sheets.

9. The electric motor according to claim 1, wherein:
   said coil assembly is inside a tubular rotor;
   said coil assembly is made of coils borne by teeth including a packet of ferromagnetic sheets;
   said teeth radially extend in relation to a tubular ferromagnetic core surrounding a core of conductive material thermally having a first section in contact with an external housing and a second section in contact with said tubular ferromagnetic core of said electric motor; and
   said core is in contact with said external housing of said electric motor in order to ensure evacuation of heat produced by said coil assembly.

10. The electric motor according to claim 9, wherein said conductive material has a T-shape.

11. The electric motor claim 10, wherein:
    said external housing has a hole for passage of an axle attached to said tubular rotor; and
    said axle operably moves a magnet set near a detection probe attached to said printed circuit.

12. The electric motor according to claim 11, further comprising a detection probe placed in an axis of a core.

13. The electric motor according to claim 11, further comprising at least one bearing located in a recess guiding said axle.

14. The electric motor according to claim 11, wherein said external housing comprises a transverse face with at least one through aperture to ensure air flow to said coil assembly.

15. The electric motor according to claim 14, wherein multiples of said through aperture are spaced apart from each other around said axle and are configured to ensure forcing of said air flowing during rotation of said rotor.

16. The electric motor according to claim 11, further comprising a ferromagnetic protuberance including an armour close to said detection probe.

17. A connection assembly comprising:
    a printed circuit including a conductive insert through which connection holes pass, said conductive insert being located between two insulating layers; and
    connection pieces comprising sections which are located within said connection holes, each of said connection pieces including at a proximal end thereof, a shoulder being laterally greater than an associated one of said connection holes;
    a distal end of said each of the connection pieces having a slot extending to said shoulder;
    a connector plug;

said distal end of said each of the connection pieces having a tapered opening with a width larger than or equal to a cross-section of said connector plug, and at least one narrowing protuberance having a width less than said cross-section of said connector plug, in order to ensure expansion of at least one of said connection pieces engaged in an associated one of said connection holes.

18. An electric motor comprising:
an electrical circuit including conductive tracks on at least one insulating layer;
a metallic and conductive insert including a connection hole, the insert being electrically connected to said circuit;
a connection being a separate part from said metallic and conductive insert and being insertable into said connection hole and perpendicularly projecting through said electrical circuit, said connection comprising a head at a first end and an openly accessible slot at an opposite end, a pair of bifurcated limbs extending from said head with said openly accessible slot between said pair of bifurcated limbs, shoulders on each limb holding said connection within said connection hole of said metallic and conductive insert;
a rotor comprising a central axle;
a stator located adjacent to said rotor and including a core, a coil surrounding a first section of said core;
an elongated electrical plug projecting from said stator and being received within said openly accessible slot of said connector to allow electricity to pass therebetween; and
said connection and said plug being laterally spaced outboard of said core of said stator, and said connection and said plug being located between said stator and said electrical circuit.

19. The electric motor according to claim 18, wherein at least one of said shoulders of said connection is part of a diagonally extending locking lug with a connection-contacting end of said at least one of said shoulders being spaced away from an associated of said pair of bifurcated limbs.

20. The electric motor according to claim 18, wherein:
said metallic and conductive insert is elongated;
said metallic and conductive insert is located within a pair of said at least one insulating layer; and
said circuit is a printed circuit.

* * * * *